United States Patent [19]

Tung et al.

[11] Patent Number: 5,374,832
[45] Date of Patent: Dec. 20, 1994

[54] ANTIFUSE HAVING TIW OXIDE FILM BETWEEN TWO METAL LAYERS

[75] Inventors: Yingsheng Tung; Scott Montgomery, both of Plano, Tex.

[73] Assignee: Texas Instruments Incorporated, Dallas, Tex.

[21] Appl. No.: 111,688

[22] Filed: Aug. 25, 1993

Related U.S. Application Data

[62] Division of Ser. No. 953,641, Sep. 29, 1992, Pat. No. 5,248,632.

[51] Int. Cl.$^5$ .................. H01L 23/525; H01L 29/42; H01L 29/68
[52] U.S. Cl. ...................... 257/50; 257/209; 257/530; 257/669
[58] Field of Search .................. 257/751, 763, 50, 530, 257/764, 665, 208, 209

[56] References Cited

U.S. PATENT DOCUMENTS

| | | | |
|---|---|---|---|
| 4,888,297 | 12/1989 | Aboelfotoh et al. | 437/41 |
| 5,166,556 | 11/1992 | Hsu et al. | 257/530 |
| 5,171,715 | 12/1992 | Husher et al. | 437/195 |
| 5,219,782 | 6/1993 | Liu et al. | 437/52 |

OTHER PUBLICATIONS

Hamdy, et al., "Dielectric Based Antifuse for Logic and Memory ICS", *IEEE*, 1988, CH528-8188/0000-0786, pp.78614 IEDM88 to IEDM 88-789.

Sato, et al., "A New Programmable Cell Utilizing Insulator Breakdown", *IEEE*, 1985, CH2252-5/85/00-00-0639, pp. IEDM85-639 to 642-IEDM85.

*Primary Examiner*—Rolf Hille
*Assistant Examiner*—Peter Toby Brown
*Attorney, Agent, or Firm*—W. James Brady, III; Richard L. Donaldson

[57] ABSTRACT

An antifuse (42) is formed by forming a layer of titanium tungsten (34) overlying a portion of a first metal layer (28). The titanium tungsten layer (34) is oxidized to form a film of oxide (36) on its surface. Insulating regions (30) are formed adjacent the titanium tungsten layer (34) and overlying the first metal layer (28). A second metal layer (40) is formed overlying the titanium tungsten layer (34). Applying a break down voltage across the first and second metal layers (28), (40) will break down the oxide film (36), thereby causing a connection between the first and second metal layers (28), (40).

16 Claims, 4 Drawing Sheets

ANTIFUSE HAVING TIW OXIDE FILM BETWEEN TWO METAL LAYERS

This is a division of application Ser. No. 07/953,641, filed Sep. 29, 1992, now U.S. Pat. No. 5,248,632.

TECHNICAL FIELD OF THE INVENTION

This invention relates in general to integrated circuits, and more particularly to an antifuse and methods of forming the same.

BACKGROUND OF THE INVENTION

In integrated circuit design, it is often desirable to have the ability to programmably create a connection between two nodes. A device which performs this function is referred to as an "antifuse". An antifuse differs from a fuse in that the initial condition of the antifuse is an open circuit, which is closed upon application of a sufficient voltage between the leads of the antifuse. A fuse, on the other hand, is initially a short-circuit, which becomes an open circuit upon applying a sufficient voltage to the leads of the fuse.

One important application for antifuses is high density programmable gate array logic where devices are programmably connected to implement a desired function. Programmable gate array logic differs from normal gate array logic in that the customer may perform the programming rather than the vendor.

Several devices have been used or proposed to supply the programmable element of a programmable gate array. SRAM and EPROM cells provide proven technology, but require a large device area, thereby limiting the number of programmable elements on the gate array. A polysilicon-to-diffusion oxide antifuse (which has polysilicon and doped silicon leads separated by an oxide barrier) has higher integration possibilities, but its performance is limited due to high junction capacitance of the diffused area. Further, the capacitance increases proportionately to the number of connected antifuses.

A polysilicon-to-polysilicon amorphous silicon antifuse (which has polysilicon leads and an amorphous silicon barrier) has potentially high integration, but suffers from high leakage and limited performance due to high polysilicon resistance. Further, the manufacturing costs of this process and the complexity of the process substantially increase the cost of providing the antifuses.

A polysilicon-to-polysilicon oxide antifuse also has potentially very high integration, but suffers from limited performance due to the high polysilicon resistance and the added manufacturing costs and complexity.

Metal-to-metal antifuses have been proposed using a deposited oxide and/or nitride layer between the metal layers. While this concept has the advantages of very high integration and high performance, a significant problem is the integrity of the antifuses due to the process control on the deposited dielectric film layer. The deposited oxide and/or nitride layer must be relatively thin in order to form a connection between the two metal layers responsive to a voltage in the range of 8–18 volts. For not being an integral part of the underlying metal layer, this thin dielectric film is deemed to suffer unwanted short-circuits between the two metal layers during the subsequent metal sintering process at 450° C.

An antifuse formed by growing an oxide region on an underlying layer of aluminum or aluminum compound metal is disclosed in U.S. patent application Ser. No. 07/626,810, now abandoned, for an Antifuse and Method of Forming the Same, which application is hereby incorporated by reference. However, aluminum is not a refractory metal. Therefore this antifuse cannot withstand temperatures in excess of approximately 400° F. This temperature limitation can be disadvantageous in the event that the integrated circuit in which the antifuse is formed must be subjected to temperatures higher than 400° F. in subsequent manufacturing processes.

Therefore, a need has arisen in the semiconductor fabrication industry to provide a metal-to-metal antifuse with high processing integrity, and which can also withstand high processing temperatures.

SUMMARY OF THE INVENTION

In accordance with the present invention, an antifuse and methods of forming the same are provided which substantially eliminate the disadvantages and problems associated with prior antifuse devices.

The antifuse of the present invention provides a first metal interconnect layer, a second metal interconnect layer, and a layer of titanium tungsten disposed between the first and the second metal interconnect layers. The titanium tungsten layer has an oxide film formed on a surface disposed against one of the metal interconnect layers.

The antifuse of this invention provides several technical advantages over the prior art. First, because the fuse is metal-to-metal, a very high performance conductive link is formed. Second, since formation of the antifuse can occur at low temperatures, it is compatible with all existing process technologies. Third, because the thickness of the TiW oxide film produced by the methods of this invention is highly uniform, consistent and predictable, the antifuse of this invention will be activated within a very narrow and highly predictable voltage range. Fourth, the antifuse of this invention can withstand high subsequent processing temperatures without failure. Finally, the methods of this invention do not require expensive additional equipment, thereby minimizing the cost of antifuse fabrication.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a cross-sectional side view of the antifuse if method 1 after a first processing stage, the antifuse being formed over a MOS transistor for illustrative purposes;

FIG. 2 illustrates a cross-sectional side view of the antifuse of method 1 after a second processing stage;

FIG. 3 illustrates a cross-sectional side view of the antifuse of method 1 after a third processing stage;

FIG. 4 illustrates a cross-sectional side view of the antifuse of method 1 after a fourth processing stage;

FIG. 5 illustrates a cross-sectional side view of the antifuse of method 2 after a first processing stage, the antifuse being formed over a MOS transistor for illustrative purposes;

FIG. 6 illustrates a cross-sectional side view of the antifuse of method 2 after a second processing stage;

FIG. 7 illustrates a cross-sectional side view of the antifuse of method 2 after a third processing stage;

FIG 8 illustrates a cross-sectional side view of the antifuse of method 2 after a fourth processing stage;

FIG. 9 illustrates a cross-sectional side view of the antifuse of method 2 after a fifth processing stage.

DETAILED DESCRIPTION OF THE INVENTION

The preferred embodiment of the present invention and its advantages are best understood by referring to FIGS. 1–10 of the drawings, like numerals being used for like and corresponding parts of the various drawings.

Figure 1:
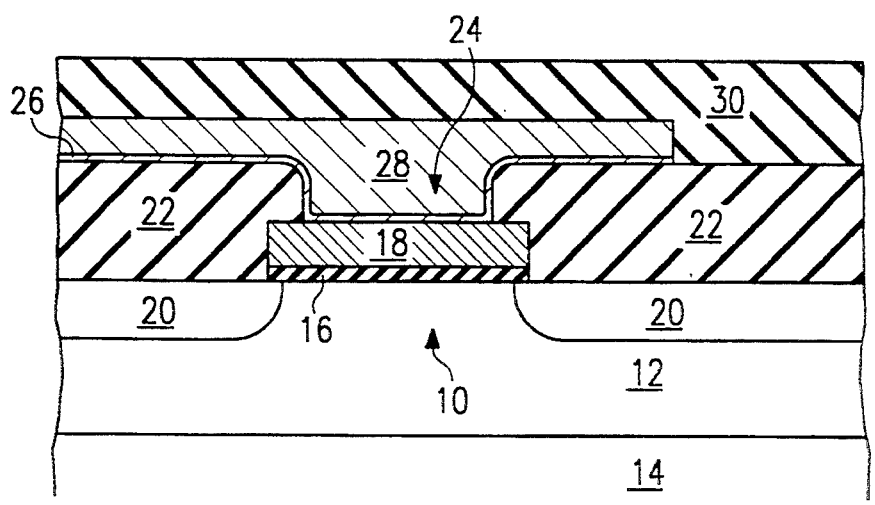
FIGS. 1–4 illustrate the first method of forming an antifuse of the present invention, and are further described as follows.

FIG. 1 illustrates a cross-sectional side view of an antifuse manufactured according to the first method of this invention, after a first processing stage. For purposes of illustration, the antifuse is shown forming a programmable contact to the gate of a MOS transistor; however, the antifuse may be used to form programmable contacts wherever desirable.

To form the MOS transistor 10, tank regions 12 (n-tank regions for p channel transistors and p- tank regions for n channel transistors) are formed in a substrate 14. Field oxide regions (not shown) are formed on the surface of the substrate 14 using a thermal oxidation process to isolate transistors. A gate oxide layer is formed on the surface of the substrate and a doped polysilicon layer is formed thereover. The layers are etched to form gate oxide layer 16 and gate 18. The source/drains 20 are formed adjacent the gate 18 by implant and diffusion. A thick insulating layer 22 is formed over the device, typically using a deposited oxide. Contact regions 24 are formed through the thick oxide layer 22 to provide contacts to the device. For illustrative purposes, only the contact region 24 formed to provide a contact to the gate 18 is shown; other contact regions would be formed to contact the diffused regions 20 as well.

A barrier layer 26 having a thickness of approximately 3000 angstroms and a first metal layer 28 having a thickness of 5000 to 8000 angstroms are formed over the device and are etched to form interconnects. The barrier layer 26 is a refractive metal to prevent junction spiking caused by forming aluminum contacts to the diffused regions 20, and may optionally be omitted in an alternative embodiment. In the preferred embodiment, TiW is used as the barrier layer 26. Also in the preferred embodiment, an aluminum copper compound is used as the first metal layer 28. Alternatively, a pure aluminum metal, an aluminum silicon alloy, or an aluminum copper silicon alloy could be used as the first metal layer 28. Also, barrier layer 26 could comprise TiN. Barrier layer 26 and first metal layer 28 may be patterned and etched using conventional dry etch techniques. After patterning and etching the first level metal interconnects, an interlevel oxide layer 30 is formed over the wafer and is planarized to a thickness of approximately 4000 to 10000 angstroms above first metal layer 28.

Figure 2:
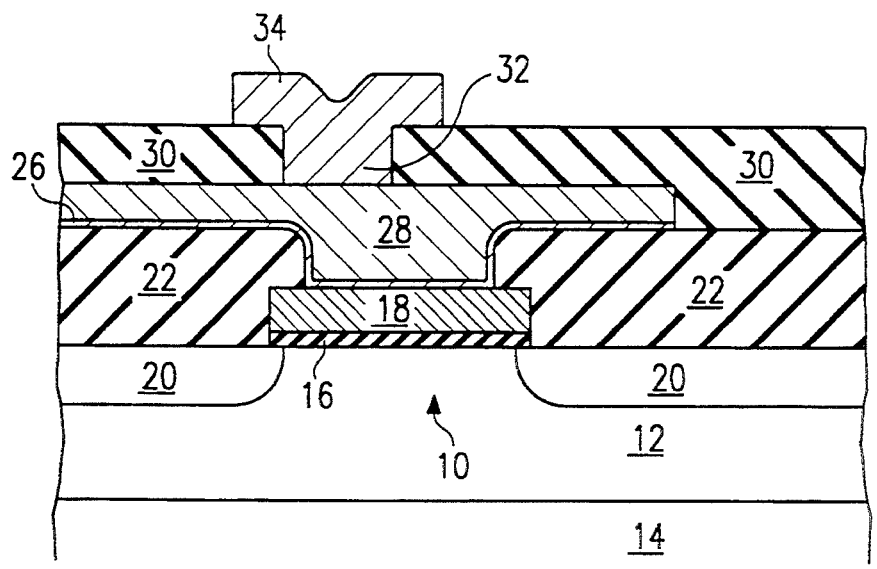

Referring now to FIG. 2, a cross-sectional side view of the antifuse of method 1 is shown after a second processing stage. An antifuse hole 32 is formed through the interlevel oxide layer 30 to expose the first metal layer 28. A layer of TiW is then deposited over interlevel oxide layer 30 and into antifuse hole 32. The deposited TiW should preferably comprise 50% titanium (Ti) and 50% tungsten(W) by volume. The TiW layer is patterned and etched to remove all except a TiW plug 34. As seen in FIG. 2, TiW plug 34 fills antifuse hole 32 and overlaps above interlevel oxide layer 30 to form a slightly larger diameter than antifuse hole 32.

Figure 3:
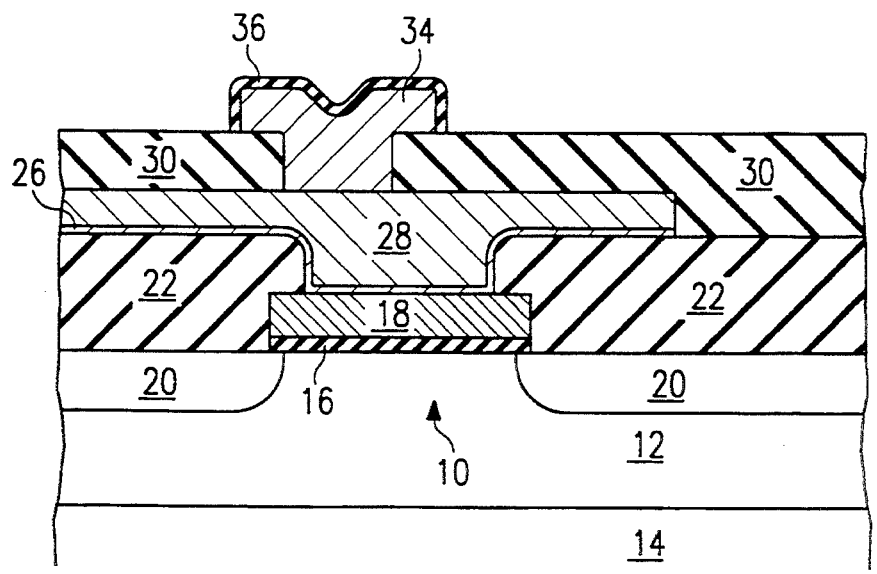

Referring now to FIG. 3, a cross-sectional side view of the antifuse of method 1 is shown after a third processing stage. In this processing stage, the TiW plug is oxidized in a plasma of ionized oxygen to oxidize its surface, forming a thin layer of TiW oxide film 36 on the surface of TiW plug 34. Any suitable plasma reactor may be used to oxidize TiW plug 34. The time period required to form TiW oxide film 36 will depend on the temperature and pressure of the ionized oxygen plasma, and on the thickness of oxide film 36 desired. These parameters are known to those skilled in the art of semiconductor fabrication.

Figure 4:
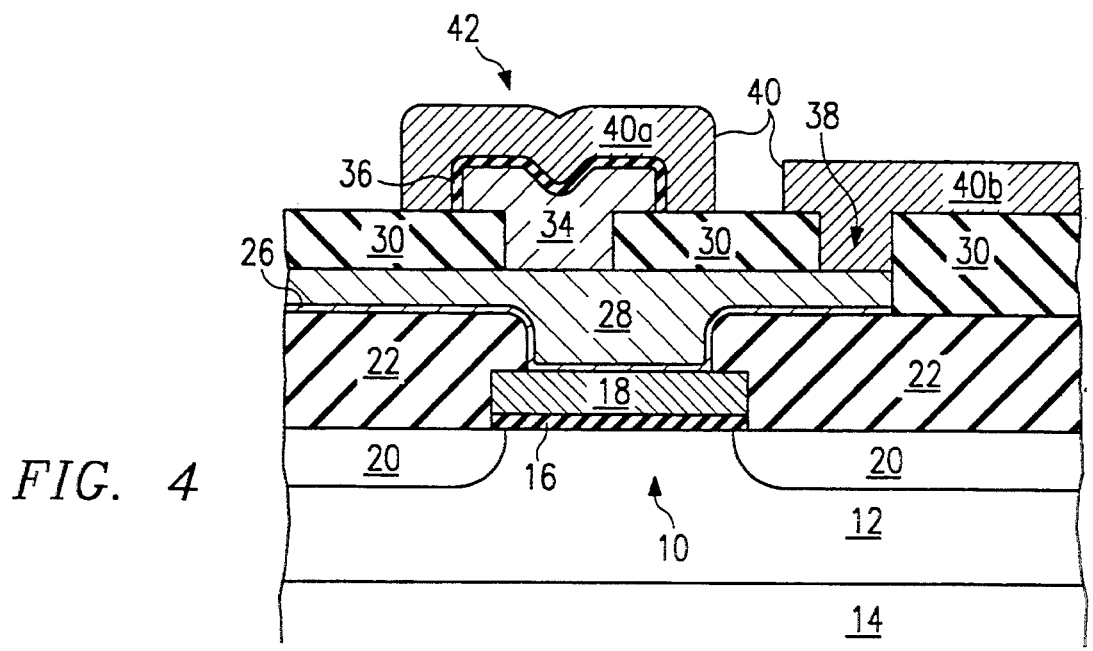

Referring now to FIG. 4, a cross-sectional side view of the antifuse of method 1 is shown after a fourth processing stage. A via contact 38 is formed through interlevel oxide layer 30 to contact first metal layer 28. A second metal layer, in the preferred embodiment an aluminum copper compound and TiW, is formed over the wafer and is patterned and etched to form second level interconnect layer 40. As shown in FIG. 4, a first interconnect 40a is coupled to first metal layer 28 via the antifuse, generally referred to by reference numeral 42. The second metal interconnect 40b is contacted to first metal layer 28 through via 38.

To program antifuse 42, a voltage is applied to the lead 40a which breaks down TiW oxide film 36. The voltage needed to break down oxide film 36 will depend upon the thickness of film 36.

Since the process for defining the interconnects and antifuses is substantially planar, additional levels of antifuses may be formed over the second metal interconnect layer 40 by repeating the steps described hereinabove, starting at formation of the interlevel oxide layer 30. Using multiple levels of interconnects, an antifuse 42 between any two metal levels, such as the first and third, can be accomplished by etching a window through the insulating layers to the lower metal layer, forming a TiW plug on the exposed portion of the lower metal layer, oxidizing the TiW plug in ionized plasma oxygen to form a TiW oxide film, and forming the upper metal layer as described hereinabove.

Figure 5:
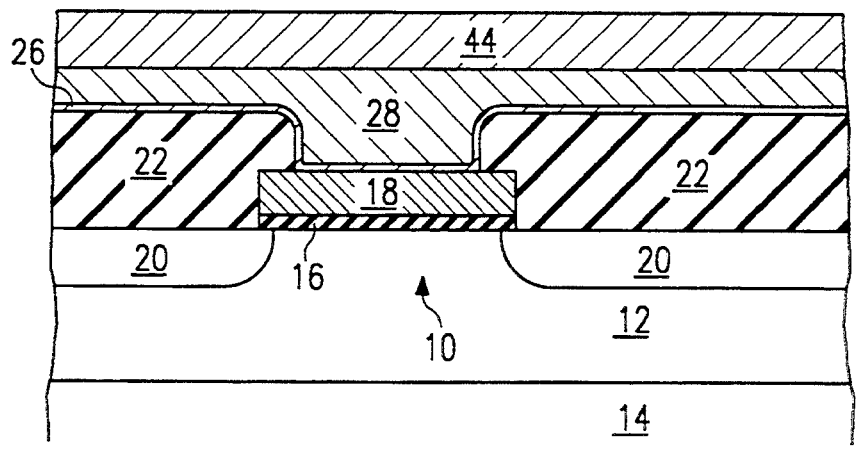
FIGS. 5–9 illustrate the second method of forming an antifuse of the present invention, and are further described as follows.

FIGS. 5–8 illustrate the second method of forming an antifuse of the present invention. FIG. 5 illustrates a cross-sectional side view of the antifuse after a first processing stage. For illustrative purposes, the antifuse is shown forming a programmable contact to the gate of an MOS transistor; however, the antifuse may be used to form programmable contacts wherever desirable. The tank regions 12, substrate 14, gate oxide layer 16, gate 18, source/drains 20, insulating layer 22, contact regions 24, barrier layer 26, and first metal layer 28 are formed in substantially the same manner as described above with reference to FIG. 1 and method 1. However, instead of interlevel oxide layer 30, a layer of TiW 44 is deposited over first metal layer 28 in the second method of this invention.

Figure 6:
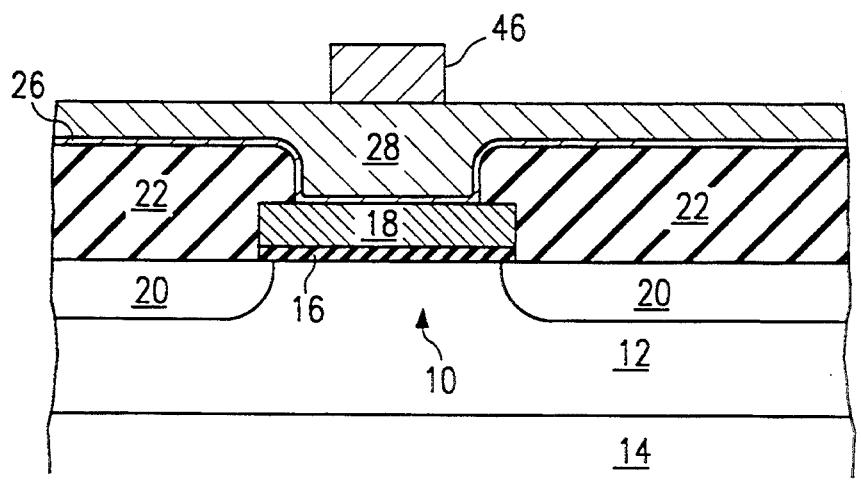

Referring now to FIG. 6, a cross-sectional side view of the antifuse of method 2 is shown after a second processing stage. In this processing stage, TiW layer 44 is patterned and etched to remove all except a cylinder of TiW 46. As seen, TiW cylinder 46 is centered above MOS transistor 10.

Figure 7:
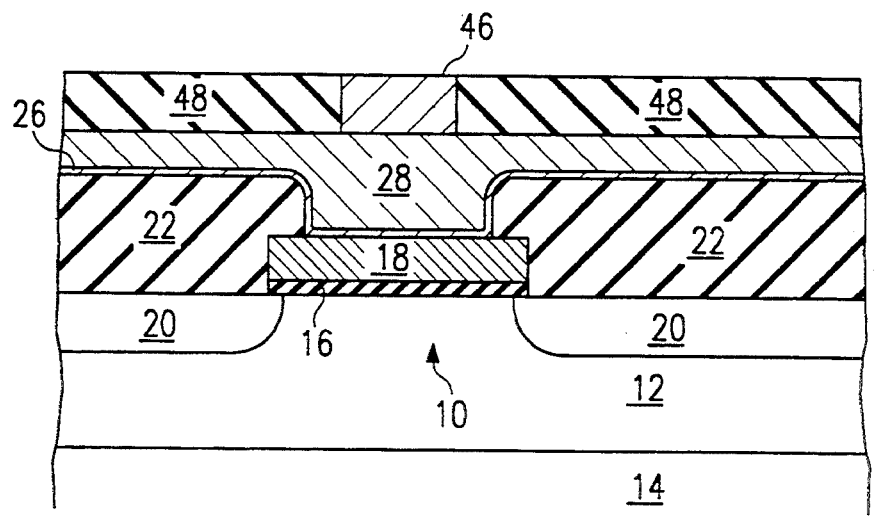

Referring now to FIG. 7, a cross-sectional side view of the antifuse of method 2 is shown after a third processing stage. In this processing stage, a layer of interlevel oxide 48 is formed over first metal layer 28 and TiW cylinder 46. Interlevel oxide layer 48 is then patterned and etched to expose only the upper surface of TiW cylinder 46.

Figure 8:
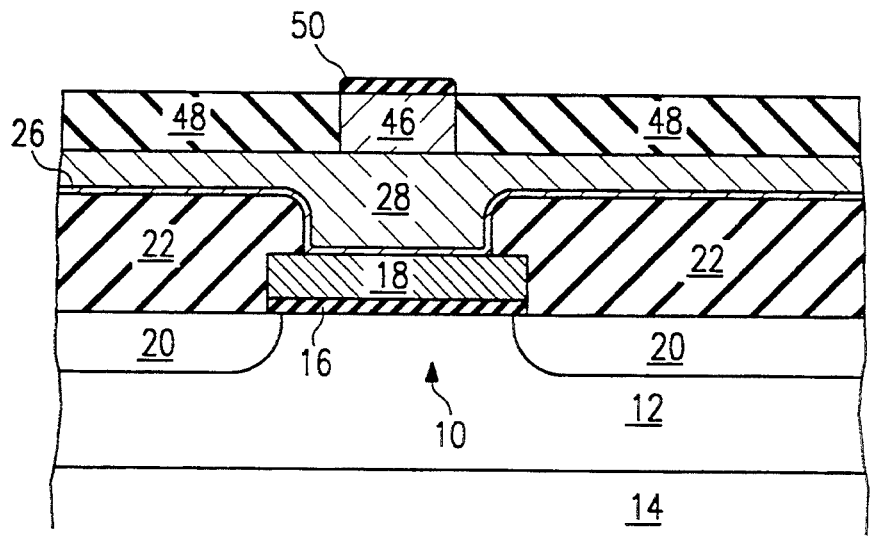

Referring now to FIG. 8, a cross-sectional side view of the antifuse of method 2 is shown after a fourth processing stage. In this processing stage, TiW cylinder 46 is oxidized in a plasma of ionized oxygen to oxidize its exposed surface, forming a thin layer of TiW oxide film 50 on the surface of TiW cylinder 46. As in the first method of this invention, any suitable plasma reactor may be used to oxidize TiW cylinder 46. The time period required to form TiW oxide film 50 will depend on the temperature and pressure of the ionized oxygen plasma, and on the thickness of oxide film 50 desired. These parameters are known to those skilled in the art of semiconductor fabrication.

Figure 9:
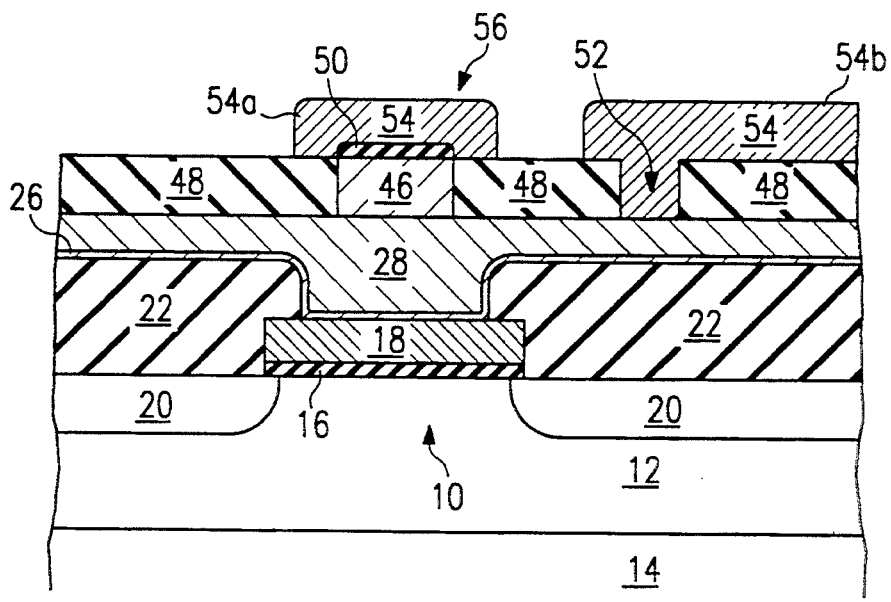

Referring now to FIG. 9, a cross-sectional side view of the antifuse of method 2 is shown after a fifth processing stage. A via contact 52 is formed through interlevel oxide layer 48 to contact first metal layer 28. A second metal layer, in the preferred embodiment, an aluminum copper compound and TiW, is formed over the wafer and is patterned and etched to form the second level interconnect layer 54. As seen in FIG. 9, a first interconnect 54a is coupled to first metal layer 28 via the antifuse, generally referred to by numeral 56. Second metal interconnect 54b is contacted to first metal layer 28 through via 52.

To program antifuse 56, a voltage is applied to lead 54a which breaks down the TiW oxide film 50. The voltage needed to break down the oxide film 50 will depend upon the thickness of film 50.

Since the process for defining the interconnects and antifuses is substantially planar, additional levels of antifuses may be formed over the second metal interconnect layer 54 by repeating the steps described hereinabove, starting at the formation of TiW layer 44. Using multiple levels of interconnects, an antifuse 56 between any two metal levels, such as the first and third, can be accomplished by depositing a layer of TiW, patterning and etching a TiW cylinder, depositing and etching back an interlevel oxide layer to expose the surface of the TiW cylinder, oxidizing the TiW cylinder in ionized plasma oxygen to form a TiW oxide film, and forming the upper metal layer as described hereinabove.

Figure 10:
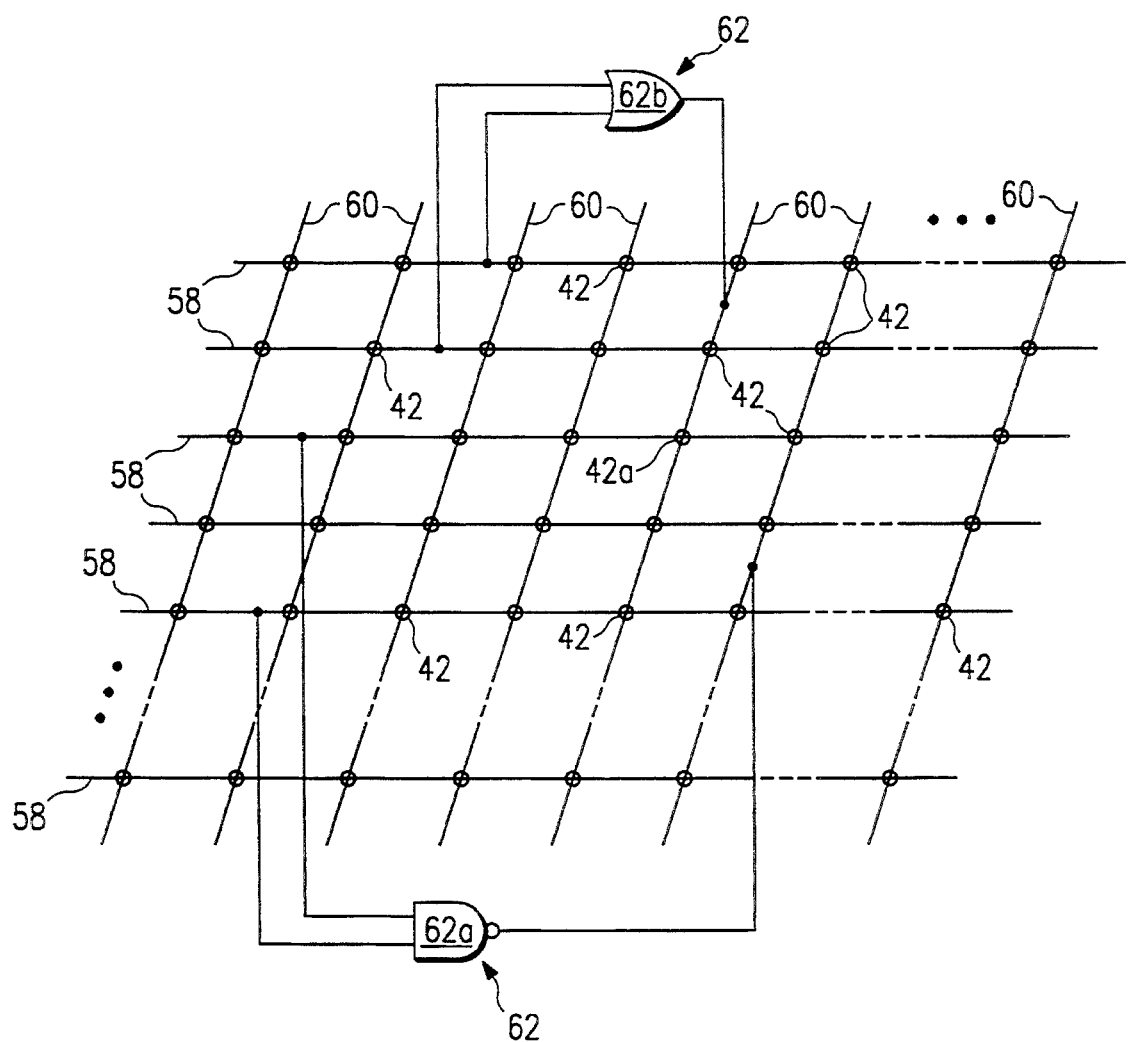
FIG. 10 illustrates a schematic representation of a programmable gate array using antifuses of the present invention.

FIG. 10 illustrates a schematic representation of a programmable gate array using antifuses 42 or 56 described hereinabove. First metal layer 28 and second metal layer 40 or 54, respectively, are patterned and etched to form substantially perpendicular interconnects 58 and 60, respectively. Antifuses 42 selectively couple intersecting interconnects. Circuit elements 62 (shown as NAND gate 62a and OR gate 62b) have input and output leads coupled to the interconnects. The input and output leads may be coupled to other circuit elements by selectively enabling the antifuses. For example, the output of OR gate 62b can be connected to one input of NAND gate 62a by enabling antifuse 42a to create a connection between the respective interconnects.

The present invention provides significant advantages over the prior art. First, because the fuse is metal-to-metal, a very high performance conductive link is formed. Second, since formation of the antifuse can occur at low temperatures, it is compatible with all existing process technologies. Third, because the thickness of the TiW oxide film produced by the methods of this invention is highly uniform, consistent and predictable, the antifuse of this invention will be activated within a very narrow and highly predictable voltage range. Fourth, the antifuse of this invention can withstand high subsequent processing temperatures without failure. Finally, the methods of this invention do not require expensive additional equipment, thereby minimizing the cost of antifuse fabrication.

Although the present invention and its advantages have been described in detail, it should be understood that various changes, substitutions and alterations can be made herein without departing from the spirit and scope of the invention as defined by the appended claims.

What is claimed is:

1. An antifuse, comprising:
    a first metal interconnect layer;
    a layer of titanium tungsten on said first metal interconnect layer;
    a titanium tungsten oxide film on said layer of titanium tungsten; and
    a second metal interconnect layer on said titanium tungsten oxide film.

2. The antifuse of claim 1, wherein the titanium tungsten layer comprises 45 to 55 percent titanium and 45 to 55 percent tungsten by volume.

3. The antifuse of claim 1, wherein the titanium tungsten layer forms a plug having a head portion with an upper surface and a shaft portion, the oxide film being formed on the upper surface of the head portion, the head portion being disposed against one of the metal interconnect layers, and the shaft portion being disposed against the other interconnect layer.

4. The antifuse of claim 1, wherein the titanium tungsten layer forms a cylinder having generally parallel first and second opposite ends, the oxide film being formed on one of the ends, each end being disposed against a different one of the metal interconnect layers.

5. The antifuse of claim 1, and further comprising a metal oxide semiconductor transistor having a gate, the antifuse forming a programmable contact to the gate of the transistor.

6. The antifuse of claim 1, wherein at least one of the first and the second metal interconnect layers comprises aluminum.

7. The antifuse of claim 6, wherein at least one of the first and second metal interconnect layers comprises an aluminum copper compound.

8. The antifuse of claim 6, wherein at least one of the first and second metal interconnect layers comprises an aluminum silicon alloy.

9. The antifuse of claim 1, further comprising planar insulating regions disposed adjacent the titanium tungsten layer and overlying the first metal interconnect layer.

10. A programmable gate array comprising:
    a plurality of circuit elements;
    a plurality of antifuses selectively coupling the circuit elements, the antifuses comprising:
        a first metal interconnect layer;
        a layer of titanium tungsten on said first metal interconnect layer;

a titanium tungsten oxide film on said layer of titanium tungsten; and a second metal interconnect layer on said titanium tungsten oxide film.

11. The gate array of claim 10, wherein at least one of the first and second metal interconnect layers comprises aluminum.

12. The gate array of claim 11, wherein at least one of the first and second metal interconnect layers comprises an aluminum copper compound.

13. The gate array of claim 11, wherein at least one of the first and second metal interconnect layers comprises an aluminum silicon alloy.

14. The gate array of claim 10, and further comprising planar insulating regions disposed adjacent the titanium tungsten layer and overlying the first metal interconnect layer.

15. An antifuse, comprising:
a layer of titanium tungsten;
a titanium tungsten oxide film on said layer of titanium tungsten; and
a first metal interconnect layer on said titanium tungsten oxide film.

16. The antifuse of claim 15 further comprising:
a second metal interconnect layer, said layer of titanium tungsten formed on said second metal interconnect layer.

* * * * *